United States Patent [19]

Cadwallader et al.

[11] 4,068,994
[45] Jan. 17, 1978

[54] APPARATUS FOR THE PRINTING OF CERAMIC GREEN SHEETS

[75] Inventors: Robert H. Cadwallader, Wappingers Falls; Yves Darves-Bornoz, La Grangeville; Angelo S. Gasparri, Stormville, all of N.Y.; Francis A. Racine, Pompano Beach, Fla.

[73] Assignee: International Business Machines Corporation, Armonk, N.Y.

[21] Appl. No.: 740,707

[22] Filed: Nov. 11, 1976

[51] Int. Cl.² .............................................. B29C 27/00
[52] U.S. Cl. .................................... 425/110; 425/811; 101/126
[58] Field of Search ............... 425/110, 385, 455, 447, 425/453, 105, 811; 101/123, 126, 114

[56] References Cited

U.S. PATENT DOCUMENTS

| 2,997,948 | 8/1961 | Scheeler et al. | 101/126 |
| 3,384,931 | 5/1968 | Cochran et al. | 425/811 X |

Primary Examiner—Robert L. Spicer, Jr.
Attorney, Agent, or Firm—Wolmar J. Stoffel

[57] ABSTRACT

An apparatus for printing a paste pattern on a ceramic green sheet having a loading station, a printing station, a stencil mask at the printing station, a carrier for supporting a green sheet, a means to align a green sheet in a given reference position on the carrier, a means to move the carrier horizontally from the loading station to a position beneath the printing station and vertically to a position to be printed beneath the stencil mask, and back to the loading station in the reverse movement order, extruding means at the printing station to print a pattern of paste material through the stencil mask on the surface of a green sheet.

8 Claims, 9 Drawing Figures

APPARATUS FOR THE PRINTING OF CERAMIC GREEN SHEETS

DISCUSSION OF THE PRIOR ART

This invention relates to printing of circuit components and more particularly to the printing of conductive patterns on a ceramic green sheet substrate.

Multilayer ceramic semiconductor packages are known in the art. This type of semiconductor package is highly desirable since various circuitry can be embodied within the substrate. In addition to making possible a more complex circuit arrangement than where a plurality of metallurgy layers is deposited on the surface of the substrate, the capacitance of the circuitry is reduced since the spacing can be made greater. This type of package is formed by initially preparing a mixture of finely divided ceramic material, a volatile solvent, and a vehicle. The mixture of ceramic material is doctor-bladed to form a thin layer and dried to drive off the volatile solvent. This leaves a thin, flexible, paper-like sheet commonly referred to as ceramic green sheet. The sheet is cut into smaller pieces and processed by punching via holes, filling the via holes with conductive paste and printing a conductive circuit pattern where desired. A plurality of the processed sheets are assembled, pressed, trimmed, and subsequently sintered in an oven at a relatively high temperature on the order of 1200° C. During the sintering operation, the vehicle and any binder materials are burned off leaving a rigid unitary ceramic body having interior interconnected conductive patterns. Suitable top and bottom metallurgies are applied to the ceramic substrate making contact to the metallurgy patterns through via holes previously punched in the green sheets. Terminals and semiconductor devices are then attached and the units encapsulated.

The handling of the individual green sheets in the aforementioned process presents formidable problems, particularly during screening operations. The ceramic green sheets are relatively fragile having a thickness on the order of 0.008 inches and extremely large in comparison to the thickness. The aligning of the green sheets relative to the mask used to form the personalized conductive patterns and for filling the via holes requires a very careful alignment, which alignment of the green sheet is normally accomplished with alignment openings punched in the edge portions of the sheet. When the green sheet is deposited over the alignment pins, it must be done very gently without damaging or enlarging the alignment holes. The prior art concerned with printing conductive patterns on rigid substrates does not provide the technology for solving this problem since the substrates in the past were rigid elements primarily alumina module substrates or resin circuit boards. In these applications, the alignment of the board relative to the mask could be achieved by utilizing the corners or edges as reference surfaces which could be grasped or secured with suitable clamps etc.

The alignment of the green sheet relative to the mask must be very precise since the scale of the conductive patterns is very small relative to the overall size of the sheet. Further, in order to reduce the cost in this competitive field, the alignment must be accomplished quickly in order to conserve costly manpower or be done by automated means. A still further problem in printing the green sheet is that any pins used to align the sheets should be retracted during the printing operation so as not to cause interference with the screening or printing device.

Thus, there exists an urgent need for a printing apparatus for processing and personalizing ceramic green sheets which will permit it to be cost competitive with other types of packages. The known printing apparatus for forming conductive patterns on rigid substrates does not provide the required technology or apparatus. The prior art concerned with printing and stenciling indicia on sheets of paper are concerned with different problems and is likewise not applicable to the problem addressed by this application since it is not generally concerned with precise alignment and the handling of a relatively soft and deformable workpiece.

SUMMARY OF THE INVENTION

Accordingly, it is an object of this invention to provide a new semi-automated or automated screening apparatus for printing conductive patterns on ceramic green sheets.

Another object of this invention is to provide a printing apparatus which is capable of quickly and carefully self-positioning a fragile sheet over a plurality of alignment pins.

Yet another object of this invention is to provide a printing apparatus in which pre-aligned masks can be rapidly interchanged to provide different personality patterns without tedious alignment procedures.

Still another object of this invention is to provide a screening apparatus in which the workpiece is deposited on a carrier at a loading station and which is subsequently automatically transferred to the printing station, printed and returned to the loading station.

These and other objects of the invention are achieved by the apparatus of the invention comprising a loading station, a printing station, a stencil mask at the printing station, a carrier for supporting a ceramic green sheet, a means to locate the ceramic green sheet in a given reference location on the carrier, a means to move the carrier horizontally to a loading station to a position beneath the printing station and vertically to a position underlying the stencil mask, a printing apparatus at the printing station to print a pattern of conductive paste through the stencil mask on the surface of the ceramic green sheet.

BRIEF DESCRIPTION OF THE DRAWINGS

Other objects and advantages will become more apparent from the following description and drawings in which.

DESCRIPTION OF PREFERRED EMBODIMENTS

Figure 2A:
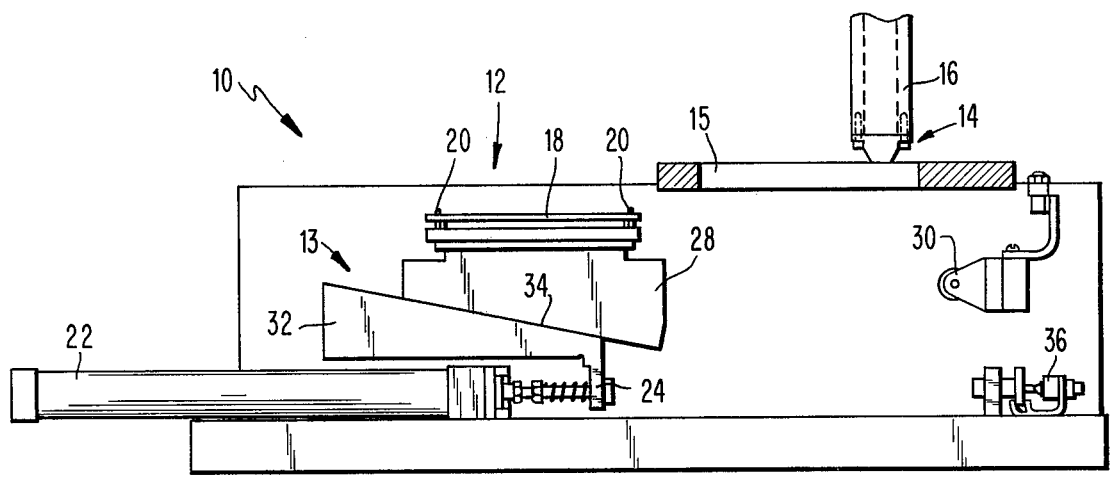
FIG. 2A, 2B and 2C detect simplified elevational views at different stages of a work cycle which illustrates the movement of the carrier as it is transferred from the loading station to the printing station.
Figure 2B:
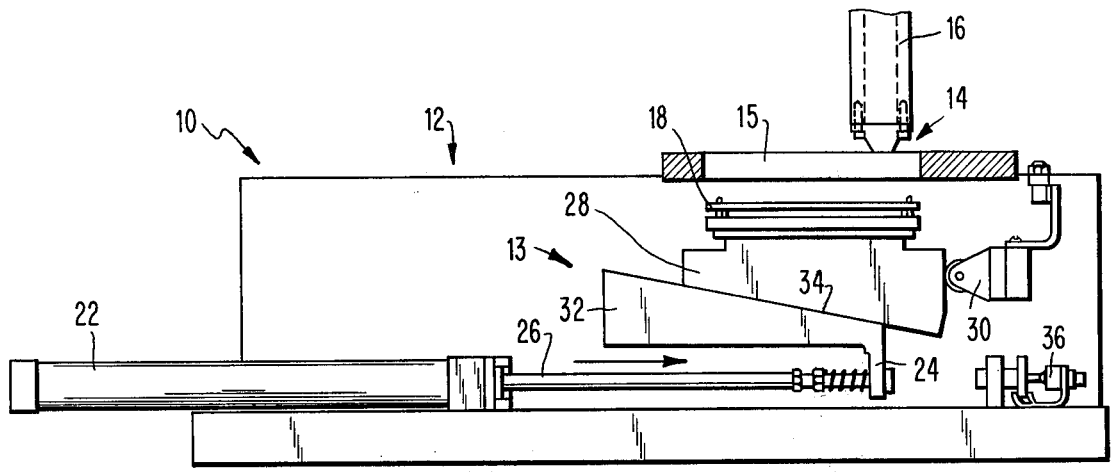
Figure 2C:
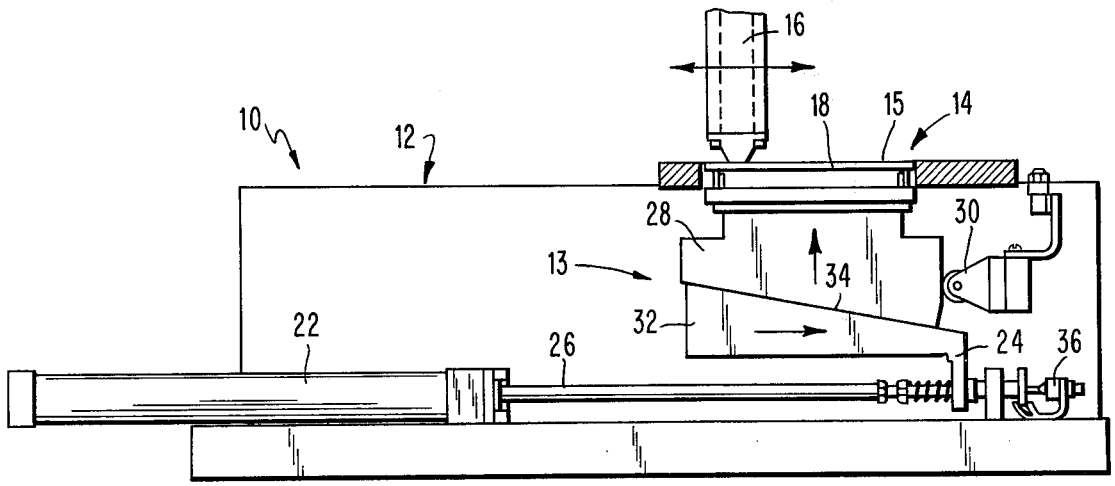

Referring now to the drawings and FIG. 2A in particular there is depicted the overall combination of elements of the apparatus of the invention in a simplified arrangement. The workpiece handling and printing apparatus 10 of the invention has a loading station 12 where workpieces, i.e. green ceramic sheets, having a plurality of alignment apertures, are loaded on a carrier 13, and a printing station 14 with a stencil mask 15 and a printing means 16, preferably an extruding type paste printer of the type depicted in U.S. Pat. No. 3,384,931. The carrier 13 has a platform 18 on which ceramic green sheets are supported in an aligned position by locating pins 20. An actuating means is provided to move the carrier 13 horizontally to a position underneath the printing station 14 and then vertically to a printing position underlying stencil masks 15 at the printing apparatus 16. This series of movements and the apparatus for achieving this movement is illustrated in FIGS. 2A and 2C. The lower part 32 of carrier 13 is slidably supported on rods or any suitable track not illustrated. An actuating cylinder 22 driven by air, steam, oil, or the like, is connected to an appendage 24 on the carrier. When the piston rod 26 of cylinder 22 is extended as shown in FIG. 2B, the carrier 13 is moved horizontally so that the platform 18 is beneath the printing station 14. Note that the upper portion 28 of the carrier is now in abutting relation to an abutment or stop 30. Further, extension of the piston rod 26 as shown in FIG. 2C forces the lower portion 32 of carrier 13 horizontally. However, the upper portion 28 is restrained from further horizontal motion by abutment 30. As the arrows indicate in FIG. 2C on carriage 13, the upper portion 28 is cammed upwardly by the inclined camming surface 34 so that the platform 18 supporting a green ceramic sheet is positioned directly below mask 15 in a position to be printed. The printing means 16 is then moved across the mask forcing conductive paste material or other paste material through the openings in the stencil mask onto the surface of the ceramic green sheet and into the via openings. As also indicated in FIG. 2C, a limit switch 36 is provided to terminate the forward movement of piston rod 26 when the upper portion of carrier 13 is cammed into position at the printing station. The carrier 13 is moved back to the loading station 12 by the reverse order of movement described previously. This movement is again achieved by withdrawal of the piston rod 26 into the cylinder 22.

Figure 4:
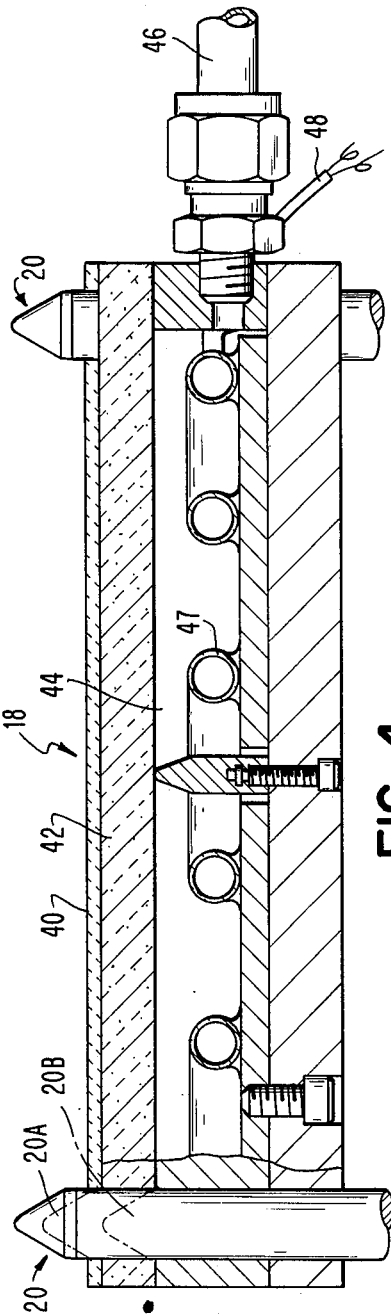
FIG. 4 is a detailed elevational view in broken section taken on line 4—4 of FIG. 1 which illustrates the specific structure of the platform for supporting the ceramic green sheet.

Referring now to FIG. 4, there is depicted the details of a preferred specific embodiment of the platform 18 for supporting the green sheet 40. Platform 18 is provided with a top plate 42 formed of a porous material, such as porous glass, which will allow passage of air or other fluid. Preferably, the plate 42 is also light pervious as will be apparent from the description that follows. Locating pins 20 are disposed through alignment apertures in ceramic sheet 40 as indicated. During the loading operation, the locating pins are withdrawn to the position 20A shown in dotted lines in FIG. 4. The green sheet 40 is then deposited over the pins while air or other fluid is admitted to the chamber 44 through conduit 46. The air flowing through the porous plate 42 from conduit 46 floats the green sheet 40 in position without stressing the green sheet material around the alignment apertures. Note that the portion of the pin 20 that projects above the surface of plate 42 is tapered. Also provided in platform 18 is a light source 47, typically a neon tube, having a power input 48 consisting of electrical wires. The light source 47 makes possible a convenient and easy inspection of the green sheet 40 supported on plate 42 of platform 18. It is apparent that this green sheet loading system is adapted for complete automation. A suitable loading apparatus for dispensing green sheets on platform 18 could be designed which could operate without human intervention. An apparatus could be likewise designed to remove the green sheet after the printing operation is complete. The operation of the platform could be made to "float" the sheet off the platform as the pins are withdrawn.

Figure 1:
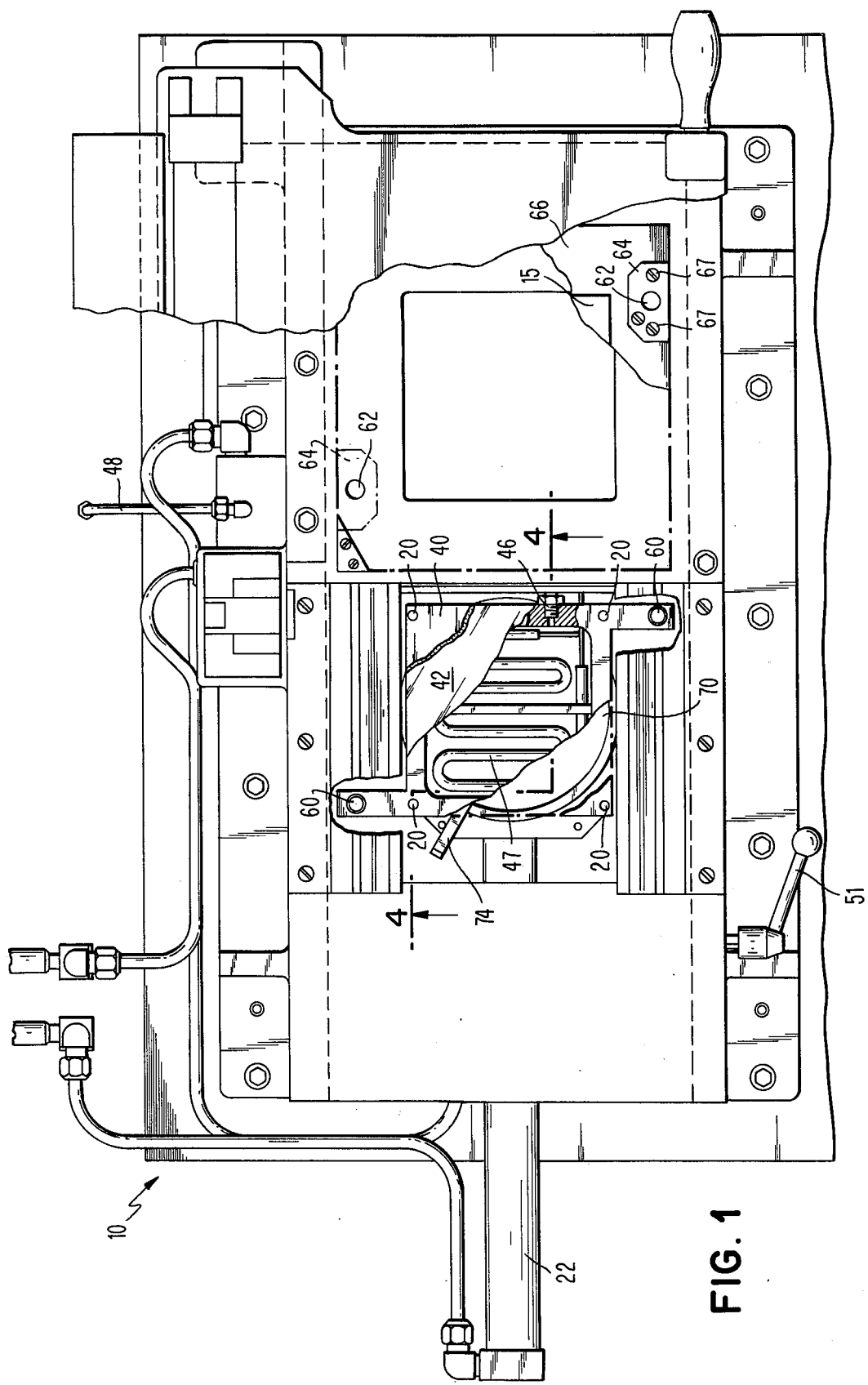
FIG. 1 is a top plan view in partially broken section illustrating a preferred specific embodiment of the apparatus of the invention.
Figure 3:
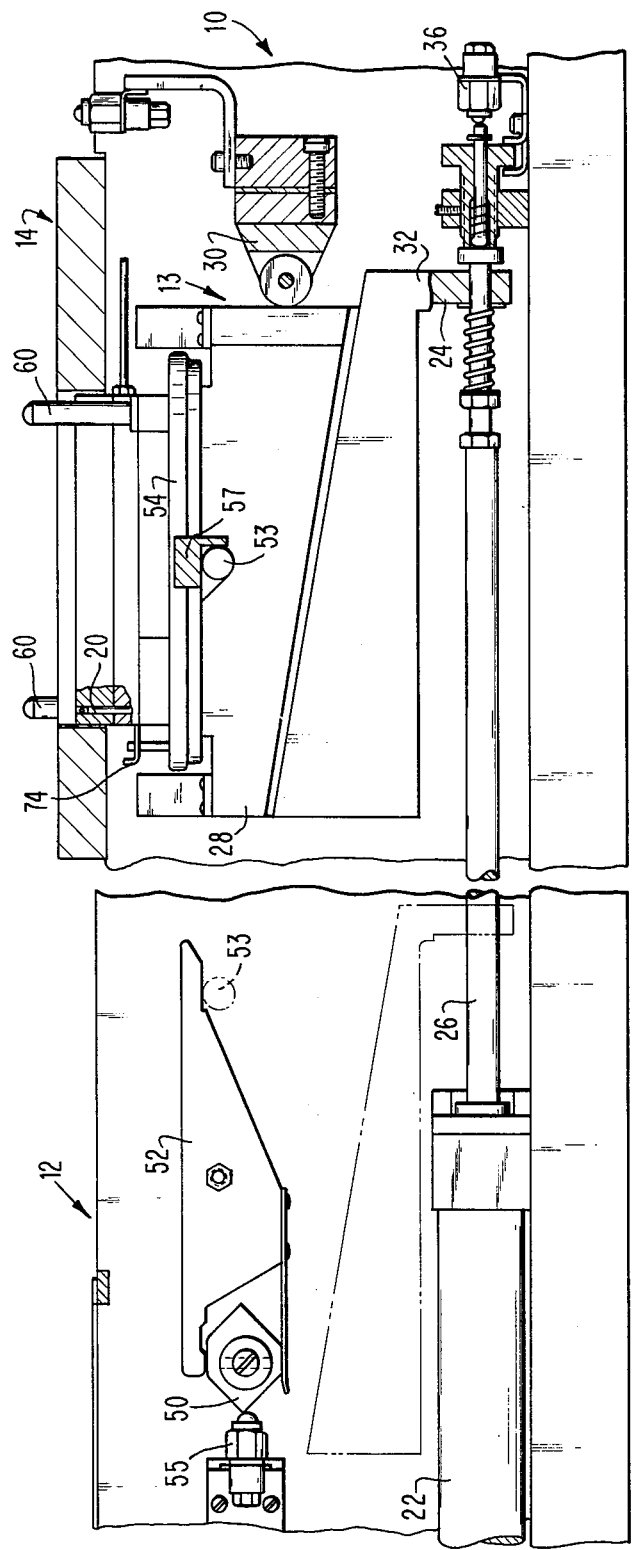
FIG. 3 is a side elevational view in broken section of the preferred embodiment of the invention depicted in FIG. 1.

Referring now to FIG. 3, the locating pins 20 are mounted on a yoke 54 that is spring-biased upwardly and supported on platform 18. Thus, when there is no restraint put on the yoke 54, the locating pins project above the top surface of platform 18 as indicated in FIG. 4. However, when the carriage is at the loading station 12, the pins must be partially retracted and air admitted to the chamber 44. This function is accomplished by cam 50 actuated by lever 51 as shown in FIG. 1. The cam 50 rotates lever 52 depressing projection 53 on yoke 54. This partially withdraws the pins 20. Simultaneously, a suitable switch 55 is actuated which results in admitting air through conduit 46 to chamber 44 which floats the green sheet. Upon further rotation of cam 50, the pins are released, the source of air turned off and a vacuum applied to chamber 44 of platform 18 which firmly holds the green sheet into position. When the carriage 13 is moved to the printing station 14, the projection 53 on yoke 54 moves into engagement with abutment 57 which completely retracts the pins 20 to the retracted position 20B shown in FIG. 4. This permits the paste extrusion head 16 to move unobstructed over the surface of the green sheet 40.

When the ceramic green sheet 40 is at the printing station 14 it is very important that there be a very precise alignment between the mask and the green sheet since the green sheet will ordinarily have a large plurality of via holes punched therein which must be filled with paste. The via holes must be aligned very carefully with a conductive pattern formed by the stencil mask and ultimately with other associated green sheet via holes and patterns. In order to assure proper alignment of the mask in the platform, a plurality of upstanding alignment projections 60 are rigidly mounted on the carriage as indicated in FIGS. 3 and 1. Alignment projections 60 are seated in apertures 62 in an adjustably mounted plate 64 carried on masking frame 66. With this arrangement, masks can be readily and very quickly interchanged to produce different part numbers. The stencil mask 15 is firmly and permanently mounted on masking frame 66. Once the masking frame 66 is aligned over the platform 18 at the printing station, its relationship to the platform 18 is preserved. The plate 64 can be adjusted to accommodate for small variations of position of the stencil mask relative to the frame. The carriage is moved to the printing station, the masking frame deposited over pins 60 with the mounting mold 67 loosely holding apertured plate 64 on the plate. After the frame is precisely adjusted to the ceramic sheet via pattern on the platform and the mounting bolts 67 are tightened to secure the apertured plate 64 in position relative to the frame 66. The mask and frame assembly can then be removed at will and replaced at any time without any further adjustment.

Figure 5:
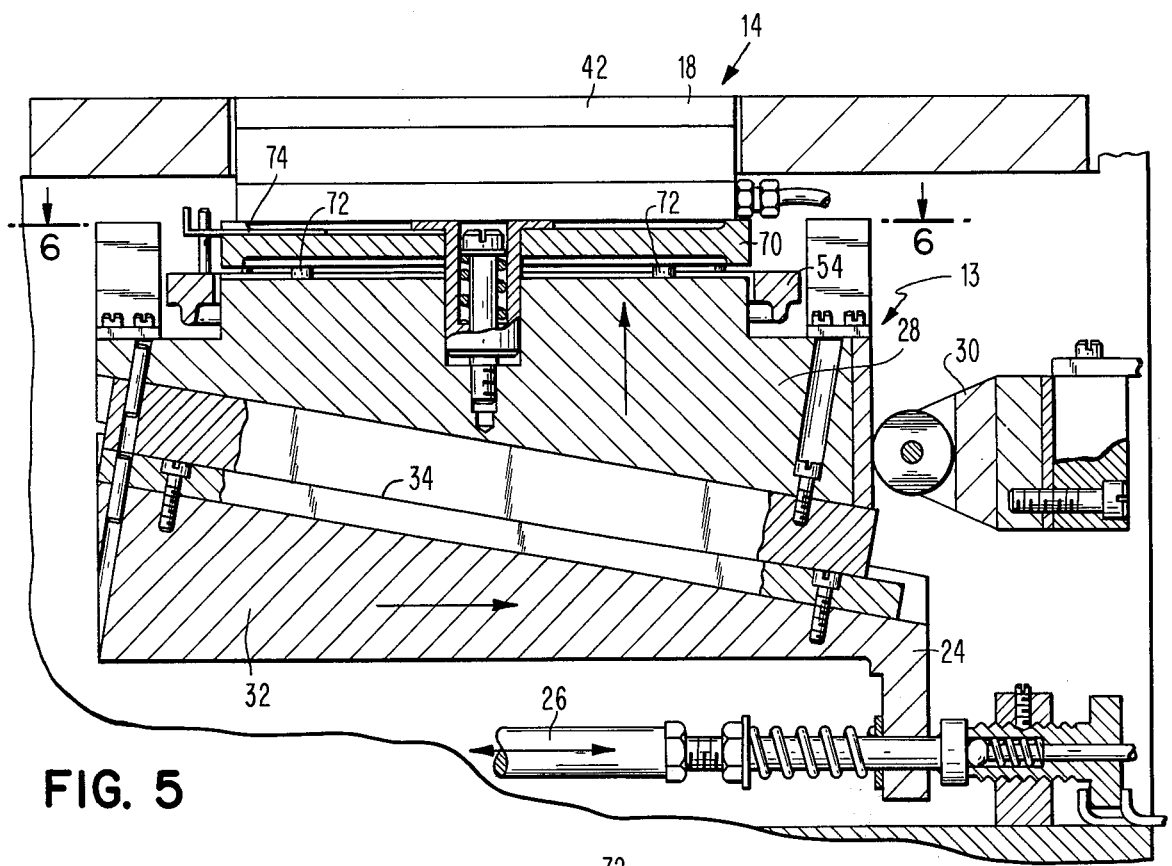
FIG. 5 is a sectional view of a preferred embodiment of the invention which illustrates in detail the height adjustment of the platform surface for supporting the ceramic green sheet.
Figure 6:
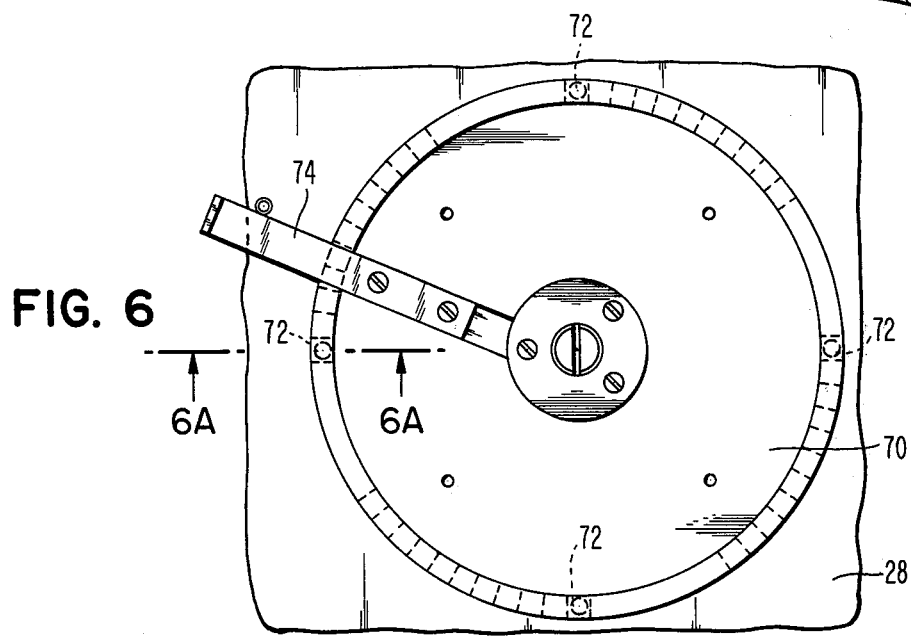
FIG. 6 is a top plan view taken on line 6—6 of FIG. 5 that illustrates the platform height adjustment structure.
Figure 6A:
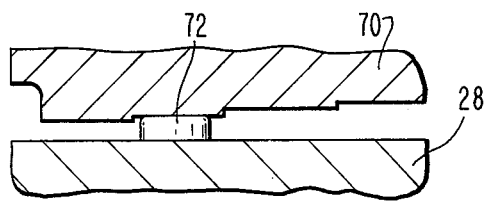
FIG. 6A is a detailed view and enlarged section taken on line 6A of FIG. 6.

Another important adjustment of the platform 18 at the printing station is the height of the top surface of the plate 42 of platform 18. This adjustment is important in order to accommodate different green sheet thicknesses, and in combination provide mask to green sheet gap. The gap may be necessary in order to separate the mask and green sheet for certain high density patterns. The structure for achieving this adjustment is illustrated in FIGS. 5, 6 and 6A. A circular member 70 is rotatably mounted on the upper portion 28 of carriage 13. Member 70 has four sets of stepped surfaces on the bottom surface which are illustrated in FIG. 6 and 6A. Four bearing members 72 selectively engage corresponding step surfaces in each of the sets. Thus, by rotating the member 70 with a suitable handle 74, a different step in each of the set of stepped surfaces can be selected since the stepped surfaces are of different heights which heights can be as small as 1 mil. The height of top surface of member 70 supports platform 18. The height of plate 42 can thereby be adjusted relative to carrier 13.

While the invention has been particularly shown and described with reference to preferred embodiments thereof, it will be understood by those skilled in the art that various changes in form and detail may be made therein without departing from the spirit and scope of the invention.

We claim:

1. An apparatus for printing a paste pattern on a ceramic green sheet provided with a plurality of alignment apertures comprising:
    a loading station;
    a printing station;
    a stencil mask at said printing station;
    a carrier for supporting a ceramic green sheet;
    a means to locate a ceramic green sheet in a given reference position on said carrier by engagement of said alignment apertures in said green sheet;
    a means to move said carrier horizontally from said loading station to a position beneath said printing station, and vertically to a position to be printed underlying said stencil mask, and back to said loading station in the reverse movement order;
    said means to move said carrier comprised of a horizontal slide for slidably supporting said carrier;
    a first lower part and a second upper part of said carrier;
    an inclined camming surface between said first and second parts of said carrier;
    an abutment for engaging said second upper part of said carrier which prevents further horizontal movement of the upper part of said carrier but allows further movement of said lower part of said carrier;
    a means to move said lower part of said carrier horizontally along with said slide;
    said means to move said lower part of said carrier capable in operation of moving the entire carrier as a unit from said loading station to a position beneath said printing station until said upper part of said carrier contacts said abutment, and to continue movement of said lower part of said carrier in a horizontal direction thereby camming said upper part of said carrier upwardly into printing position relative to said stencil mask, and to return the carrier to said loading station by the reverse order of said movements.

2. The apparatus of claim 1 wherein said carrier is provided with a porous surface element for supporting a ceramic green sheet, and a means to draw a vacuum through said porous surface element to thereby securely hold a ceramic green sheet in aligned position on said carriage.

3. The apparatus of claim 1 which further includes a means to precisely align said carrier and said stencil mask at said printing station.

4. The apparatus of claim 3 wherein said means to precisely align includes a plurality of vertically extending alignment pins mounted on said carrier,
    a frame mounting said stencil mask;
    a support means releasably mounting said frame at said printing station, apertured plates on said frame for slidably receiving said alignment pins; and
    means for adjustably securing said apertured plates to said frame.

5. An apparatus for printing a paste pattern on a ceramic green sheet provided with a plurality of alignment apertures comprising:
    a loading station;
    a printing station;
    a stencil mask at said printing station;
    a carrier for supporting a ceramic green sheet;
    an adjustment means on said carrier for precisely controlling the surface height of the carrier, said adjustment means comprised of a plurality of bearing surfaces arranged in a circle on said carrier, a circular platform member having a plurality of stepped surfaces rotatably mounted above said plurality of bearing surfaces;
    a means to rotate said platform support member, said adjustment means in operation capable of varying the surface height of said carriage when said circular platform support member is rotated relative to said plurality of bearing surfaces to thereby change the setting on said stepped surfaces;
    a means to locate a ceramic green sheet in a given reference position on said carrier by engagement of said alignment apertures in said green sheet;
    a means to move said carrier horizontally from said loading station to a position beneath said printing station, and vertically to a position to be printed underlying said stencil mask, and back to said loading station in the reverse movement order;
    a means at said printing station to print a pattern of paste material through said stencil mask to the surface of a ceramic green sheet.

6. An apparatus for printing a paste pattern on a ceramic green sheet provided with a plurality of alignment apertures comprising:
    a loading station;
    a printing station;
    a stencil mask at said printing station;
    a carrier for supporting a ceramic green sheet;
    a means to locate a ceramic green sheet in a given reference position on said carrier by engagement of said alignment apertures in said green sheet;
    said means to locate a ceramic green sheet comprised of
    a plurality of vertical, longitudinally slidably tapered locating pins disposed in the top surface of said carriage positioned to engage said plurality of alignment apertures in a ceramic green sheet, a porous surface element on said carrier for supporting said green sheets;

means to force a fluid through said porous surface element and thereby float a green sheet;

means to draw a vacuum through said porous surface element to thereby securely hold said green sheet;

means to extend said locating pins and activate said means to force a fluid through said porous surface element and to subsequently draw a vacuum through said porous surface element and withdraw said locating pins prior to printing a pattern of paste on said ceramic green sheet, a means to move said carrier horizontally from said loading station to a position beneath said printing station, and vertically to a position to be printed underlying said stencil mask, and back to said loading station in the reverse movement order;

a means at said printing station to print a pattern of paste material through said stencil mask to the surface of a ceramic green sheet.

7. The apparatus of claim 6 wherein said porous surface element is light pervious, and a light emitting element is disposed beneath said surface element to facilitate inspection of a ceramic green sheet while on said porous surface element.

8. An apparatus for printing a paste pattern on a ceramic green sheet provided with a plurality of alignment apertures comprising:
 a loading station;
 a printing station;
 a stencil mask at said printing station;
 a carrier for supporting a ceramic green sheet;
 a means to locate a ceramic green sheet in a given reference position on said carrier by engagement of said alignment apertures in said green sheet;
 said carrier provided with a light pervious element for supporting said ceramic green sheet, and a light emitting element disposed beneath said light pervious element to facilitate inspection of a ceramic green sheet on said light pervious element;
 a means to move said carrier horizontally from said loading station to a position beneath said printing station, and vertically to a position to be printed underlying said stencil mask, and back to said loading station in the reverse movement order;
 a means at said printing station to print a pattern of paste material through said stencil mask to the surface of a ceramic green sheet.

* * * * *